(12) United States Patent
Ejima

(10) Patent No.: US 7,759,799 B2
(45) Date of Patent: Jul. 20, 2010

(54) SUBSTRATE AND SEMICONDUCTOR DEVICE

(75) Inventor: Daisuke Ejima, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 695 days.

(21) Appl. No.: 11/650,459

(22) Filed: Jan. 8, 2007

(65) Prior Publication Data

US 2007/0164445 A1    Jul. 19, 2007

(30) Foreign Application Priority Data

Jan. 13, 2006    (JP) .............................. 2006-005697

(51) Int. Cl.
*H01L 23/48* (2006.01)

(52) U.S. Cl. ......................................... 257/773; 257/734

(58) Field of Classification Search ................. 257/773, 257/734

See application file for complete search history.

(56) References Cited

U.S. PATENT DOCUMENTS 7,534,657 B2 *    5/2009    Yamaguchi et al. .......... 438/115

FOREIGN PATENT DOCUMENTS

| JP | 9-8081 | 1/1997 |
| JP | 2004-289002 | 10/2004 |

* cited by examiner

*Primary Examiner*—Douglas M Menz
(74) *Attorney, Agent, or Firm*—Young & Thompson

(57) ABSTRACT

Aiming at adjusting the height of bump electrodes connected to lands on a substrate, a semiconductor device 100 has a first interconnect substrate 103 and a second interconnect substrate 101. On one surface of these substrates, first lands 111 and second lands 113 are provided. The plane geometry of the second lands 113 is a polygon characterized by the inscribed circle thereof having an area smaller than the area of the inscribed circle of the first land.

15 Claims, 19 Drawing Sheets

100

113

111 though yield ratio or facilitating tests, in that problem analysis in case of nonconformities is facilitated, in that passive components can be mounted together therewith, so that high-speed, high-density mounting can be realized, in that commercial packages are mountable, so that the technology is versatile for many applications, and in that the technology can flexibly afford various module types and geometries, and is consequently excellent in design flexibility.

SUBSTRATE AND SEMICONDUCTOR DEVICE

This application is based on Japanese patent application No. 2006-005697 the content of which is incorporated hereinto by reference.

BACKGROUND

1. Technical Field

The present invention relates to a substrate on which a semiconductor chip is mounted, and a semiconductor device using the same.

2. Related Art

In semiconductor devices, semiconductor chips having a large number of circuit elements such as transistors, resistors, capacitors and so forth formed therein are mounted typically on interconnect substrates. The circuit elements are interconnected so as to allow the semiconductor devices to exhibit circuit operations and functions required thereto. Methods of interconnecting the semiconductor chips and the interconnect substrates include the wire bonding method using gold wires, and the flip-chip bonding method connecting so as to oppose the circuit-formed surfaces with the surfaces of the interconnect substrates.

High-density mounting technologies of the semiconductor devices include a technology called SoC (system-on-chip) realizing a plurality of functions in a single system on the silicon basis, and a SiP (system-in-package) realizing a plurality of functions including those of memories, CPUs (central processing units) and so forth in a single package mounting. At present, the SiP technique attracts a public attention as a complementary technology for SoC.

In addition, PoP (package-on-package) technology has appeared as the next-generation technology coming after the SiP technology, characterized by mutually stacking packages. Major advantages of the PoP technology over the chip-stacking technology, which has currently been a mainstream of the SiP technology, reside in that production efficiency and cost are improved through improving yield ratio or facilitating tests, in that problem analysis in case of nonconformities is facilitated, in that passive components can be mounted together therewith, so that high-speed, high-density mounting can be realized, in that commercial packages are mountable, so that the technology is versatile for many applications, and in that the technology can flexibly afford various module types and geometries, and is consequently excellent in design flexibility.

A semiconductor device based on the PoP technology is composed of two or more packages, wherein the individual terminals are mutually connected by solder balls. In the base package, semiconductor chips are mounted on the interconnect substrate making use of various techniques, and thereby the semiconductor chips and the interconnect substrate are connected.

One of representative bonding techniques is such as mounting semiconductor chips onto any one of the upper or the lower surface, or onto both surfaces of the interconnect substrate through gold bumps or solder bumps, while making the circuit-formed surfaces of the semiconductor chips opposed to the interconnect substrate surfaces so as to attain flip-chip mounting, and then reinforcing the bond portion of the flip-chip bonding with an underfill resin. Another technique is such as bonding the semiconductor chips and the interconnect substrate by the wire bonding method using gold wires, and then molding them with a resin material by the potting process, the top-gate process or the printing process. Still other techniques include a technique of burying the semiconductor chips into the interconnect substrate, and a technique of disposing through-hole electrodes so as to mold entire surfaces of the bonded semiconductor chips.

The base package has lands, or bumps composed of an electro-conductive material such as solder balls, on the external terminal thereof on the lower surface of the bonding portion on the upper surface of the base package. This sort of base package is stacked and bonded with a package (also referred to as "infant package", hereinafter) having bonding portion terminals corresponded to the bonding portion terminals formed on the upper surface of the base package. The base package is occasionally stacked with an interconnect substrate having semiconductor chips, chip-type capacitors, chip-type resistors and so forth mounted thereon. Still another case relates to the base package stacked with a relay substrate which plays a role of a spacer for the convenience of mounting of packages and so forth. The infant packages, the interconnect substrate, the relay substrate and so forth are stacked on the base package through the solder balls, a solder paste and the like, heated typically by the re-flow process, and thereby bonded.

In this sort of PoP technology, there has conventionally been concerned that warping generated in the packages may result in bonding failure between the packages. This sort of problem is ascribable to difference in the thermal expansion coefficients depending on configurations of the individual packages. Any efforts of ensuring a desirable bonding have occasionally limited the package design and materials.

Paragraphs below will described the bonding failure between the packages, referring to FIGS. 13A to 15B. These drawings are sectional views showing semiconductor devices at a temperature where solder is fused.

In the semiconductor devices shown in FIGS. 13A to 15B, and FIGS. 16A to 17B, a first interconnect substrate 203 and a second interconnect substrate 201 are stacked. The first interconnect substrate 203 is an interconnect substrate composing the base package, and the second interconnect substrate 201 is an interconnect substrate composing the infant package.

The first interconnect substrate 203 has a plurality of lands 213 provided on the surface thereof opposed to the second interconnect substrate 201. The first interconnect substrate 203 has the lands 213 arranged at the locations corresponded to the locations of the lands provided on the second interconnect substrate 201. The first interconnect substrate 203 also has a plurality of second solder balls 219 provided on the back surface opposite to the chip-mounting surface.

Also the second interconnect substrate 201 has a plurality of lands 213 provided on the surface thereof opposed to the first interconnect substrate 203. The individual lands 213 are respectively connected with first solder balls 215. The second interconnect substrate 201 is molded with a molding resin 221 on the back surface thereof opposite to the surface faced to the first interconnect substrate 203.

As shown in FIG. 13A, FIG. 14A, FIG. 15A, FIG. 16A and FIG. 16B, the first interconnect substrate 203 has a semiconductor chip 205 mounted on the surface thereof opposite to the second interconnect substrate 201. As shown in FIG. 13B, FIG. 14B, FIG. 15B, FIG. 17A and FIG. 17B, the semiconductor chip 205 is formed on the first interconnect substrate 203 specifically on the back surface thereof opposite to the surface opposed with the second interconnect substrate 201. Whichever for the case where the semiconductor chip 205 is mounted on either surface of the first interconnect substrate 203, an underfill resin 207 is provided between the semiconductor chip 205 and the first interconnect substrate 203. Conductive components (not shown) of the semiconductor chip 205 and conductive components (not shown) of the first interconnect substrate 203 are connected through bonding bumps 209.

FIG. 13A to FIG. 15B shows problems of concave warping and convex warping of the base wafer, encountered when the infant package, after being molded with a resin together with a semiconductor chip mounted thereon, is stacked on the base package having the semiconductor chip 205 mounted by flip-chip bonding onto the first interconnect substrate 203, and subjected to the re-flow process.

FIG. 13A and FIG. 13B show the first solder balls 215 on the infant package failed in making contact with the lands 213 on the base package, while leaving unconnected portion 251, in a region where a gap between the individual packages is widened due to the warping.

FIG. 14A and FIG. 14B show the first solder balls 215 collapsed and flattened in a region where a gap between the packages is narrowed due to the wrapping. The solder balls swells out from the lands 213 to contact with the substrate, no more keeping the spherical geometry, and is almost likely to produce bridged portions 253.

FIG. 15A and FIG. 15B shows the first solder balls 215 collapsed and flattened in a portion where the gap between the packages is narrowed due to the warping, forming solder ball collapsed portion 257. The solder ball collapsed portion 257 swells out from the lands 213 to contact with the substrate, deforming themselves into distorted geometry rather than sphere. FIG. 15A and FIG. 15B show the first solder balls 215 once fused and bonded but stretched to produce a cylindrical form in a region where the gap between the packages is widened, forming solder ball stretched portion 255. Formation of the solder ball stretched portion 255 and the solder ball collapsed portion 257 may also result in separation of the first solder balls 215 from the lands 213 in these portions, in the re-flow process for mounting onto mounting boards.

Conventionally known techniques of suppressing this sort of problems include those described in Japanese Laid-Open Patent Publication No. H9-8081 and Japanese Laid-Open Patent Publication No. 2004-289002.

Japanese Laid-Open Patent Publication No. H9-8081 describes a technique of making difference in the land area depending on the degree of warping of a BGA substrate.

According to Japanese Laid-Open Patent Publication No. 2004-289002, an effort is made on adjusting the height of the solder balls by varying aperture of the bonding lands used for bonding with a package. This configuration reportedly makes it possible to stack packages different in states of warping.

FIG. 16A, FIG. 16B, FIG. 17A and FIG. 17B are sectional views showing a semiconductor device corresponded to the device configuration described in this patent publication. As shown in FIG. 16A and FIG. 16B, the base package having the semiconductor chip 205 mounted on the top surface of the first interconnect substrate 203 is stacked with the second interconnect substrate 201 of the infant package after being molded with a resin together with a semiconductor chip mounted thereon. As shown in FIG. 17A and FIG. 17B, the base package having the semiconductor chip 205 mounted on the lower surface of the interconnect substrate 203 is stacked with the second interconnect substrate 201 of the infant package after being molded with a resin together with a semiconductor chip mounted thereon.

The base package shown in FIG. 16A and FIG. 16B shows concave warping. The base package shown in FIG. 17A and FIG. 17B shows convex warping. Due to the warping, the gap between the individual packages causes variation in the width by locations.

According to this patent publication, exposed area of the lands is then adjusted by providing an insulating film for adjusting aperture thereof on the lands on the interconnect substrate 203. More specifically, second lands 263 are provided in a region where the gap between the packages is widened. The second lands 263 have, formed thereon, second openings 267 having a smaller aperture than in the other region. On the other hand, first lands 261 are provided in a region where the gap between the packages is narrowed. The first lands 261 have, formed thereon, first openings 265 having a larger aperture than in the other region.

However, the above-described techniques described in Japanese Laid-Open Patent Publication No. H9-8081 and Japanese Laid-Open Patent Publication No. 2004-289002 are still remained for further improvement in bonding reliability between the substrates only with simple configurations.

For example, the exposed area of the lands in the above-described Japanese Laid-Open Patent Publication No. 2004-289002 has been adjusted by controlling the aperture of the insulating film provided on the lands, while leaving the plane geometry of the lands unchanged. It has, therefore, been anticipated that design of the insulating film is more complicated.

SUMMARY OF THE INVENTION

According to the present invention, there is provided a substrate comprising a first land and a second land provided on one surface thereof, wherein the plane geometry of the second land is a polygon characterized by the inscribed circle thereof having an area smaller than the area of the inscribed circle of the first land.

According to the present invention, there is provided also a semiconductor device comprising the substrate of the present invention described in the above, and a semiconductor chip stacked thereon.

According to the present invention, there is provided still also a semiconductor device which include:

a first substrate;

a second substrate provided as being opposed with the first substrate; and a semiconductor chip mounted on the first substrate or on the second substrate, wherein the first substrate is the substrate of the present invention described in the above, and a gap between the first substrate and the second substrate in the region having the second lands arranged therein is larger than a gap between the first substrate and the second substrate in the region having the first lands arranged therein.

In the present invention, a plurality of lands differed in the plane geometry are provided on one surface of the substrate, wherein the plane geometry of the second lands is a polygon characterized by the inscribed circle thereof having an area smaller than the area of the inscribed circle of the first lands. By making difference between the areas of the inscribed circles of the first lands and the second lands, areas of regions in the lands, over which the bump electrodes connected thereto tend to spread, can be differed from each other.

The bump electrodes herein can spread over the entire lands when materials of the bump electrodes are heated and liquefied, and the both are bonded. The liquefied electrode material, however, tend to form spheres on the lands. The bump electrodes have a tendency of staying on the lands, particularly within the inscribed circle thereof. In other words, the degree of in-plane spreading of the bump electrodes is determined by the area of inscribed circle of the lands, and the bumps mainly reside in a region on the inscribed circles. In particular on the second lands, the bump electrodes are bonded mainly within the inscribed circles of the second lands, as a result of surface tension acts on the corners of the polygon.

In the present invention, the height of the bump electrodes are adjusted by making difference in the area of the inscribed circles of a plurality of lands, making use of the sphere-forming nature of solder. The degree of spreading of the bump electrodes over the second lands can be adjusted, depending on the polygonal geometry of the second lands. According to the present invention, it is therefore made possible to adjust the height of the bump electrodes to be bonded to the first lands and the second lands, without altering the volume of the bump electrodes. The height of the bump electrodes is, therefore, adjustable corresponding to the gap between the packages. As a consequence, the height of the bump electrodes is adjustable corresponding to the distance between the substrates, even when warping occurs at least on a substrate or a separate substrate provided as being opposed thereto, and the distance between the substrates is not uniform. It is therefore made possible to suppress bonding failure otherwise occurs when the substrates are connected through the bumps.

More specifically, the inscribed circle of the second lands is smaller than the inscribed circle of the first lands, so that the height of the bumps to be bonded to the second lands can be made larger than the height of the bumps to be bonded to the first lands, without altering the volume of the bump electrodes to be bonded to these lands. By virtue of this configuration, the substrates can reliably be bonded while avoiding bonding failure, even when the distance between the first substrate and the second substrate in the region having the second lands disposed therein is larger than the distance between these substrates in the region having the first lands formed therein.

The polygon of the second lands may have sharp corners or rounded corners, so far as the bump electrodes on the second lands can be bonded while keeping themselves within the inscribed circle thereof. Examples of the polygon include regular polygon and cross allowing the inscribed circle to contact with four corners thereof.

In the present invention, the first lands and the second lands may have a nearly equal area. This configuration can nearly equalize the bonding areas of the solder bumps on the first lands and the second lands, and can thereby more exactly suppress variation in the bonding strength at the first lands and the second lands. When a plurality of lands are disposed at a regular pitch in rows or in a lattice, either one of the space between the adjacent first lands and the space between the adjacent second lands can be adjusted so that either one of which never becomes extremely narrower than the other. This configuration can therefor ensure a sufficient interconnect space both between the adjacent first lands and between the adjacent second lands.

It is to be noted that any arbitrary combination of these configurations, and any expressions of the present invention exchanged among method, apparatus and so forth are effective as embodiments of the present invention.

As has been described in the above, the present invention can readily adjust the height of the bump electrodes to be bonded to the lands on the substrates.

BRIEF DESCRIPTION OF THE DRAWINGS

The above and other objects, advantages and features of the present invention will be more apparent from the following description taken in conjunction with the accompanying drawings, in which.

DETAILED DESCRIPTION

Figure 1:
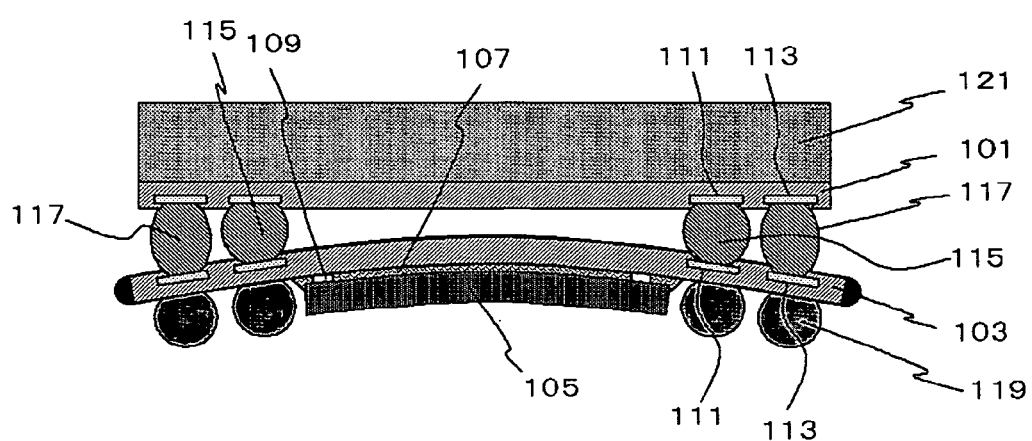
FIG. 1 is a sectional view showing a configuration of a semiconductor device in one embodiment.

The invention will be now described herein with reference to an illustrative embodiment. Those skilled in the art will recognize that many alternative embodiments can be accomplished using the teachings of the present invention and that the invention is not limited to the embodiment illustrated for explanatory purposes.

Paragraphs below will explain embodiments of the present invention, referring to the attached drawings. It is to be noted that any common constituents appear in all drawings will be given with the same reference numerals, so as to avoid repetitive explanation.

First Embodiment

Figure 2:
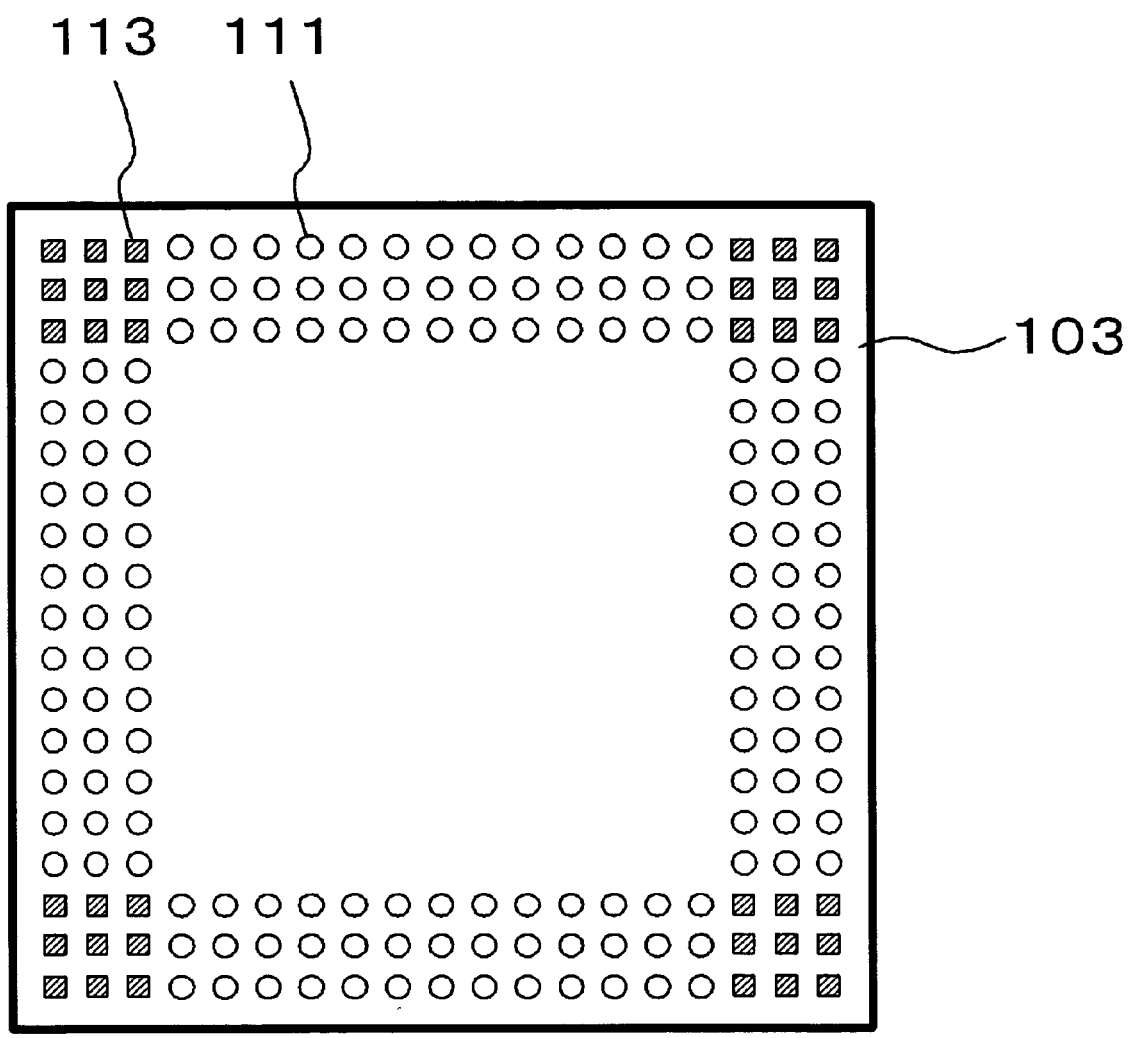
FIG. 2 is a plan view showing a configuration of the first interconnect substrate of the semiconductor device shown in FIG. 1.

FIG. 1 is a sectional view showing a configuration of a semiconductor device of this embodiment. FIG. 2 is a plan view showing a plane geometry and arrangement of the lands on the first interconnect substrate 103 of the semiconductor device shown in FIG. 1. Also the plane geometry and plane arrangement of the lands on the second interconnect substrate 101 may be same as those shown in FIG. 2.

A semiconductor device 100 shown in FIG. 1 includes a first substrate (first interconnect substrate 103), a second substrate (second interconnect substrate 101) provided so as to oppose with one surface of the first interconnect substrate 103, and a semiconductor chip 105 mounted on the second interconnect substrate 101 or on the first interconnect substrate 103. FIG. 1 shows that the semiconductor chip 105 is mounted on the first interconnect substrate 103, so that the first interconnect substrate 103 and the semiconductor chip 105 are stacked.

The first interconnect substrate 103 and the second interconnect substrate 101 are package substrates. The plane geometry of the first interconnect substrate 103 and the second interconnect substrate 101 is a near-regular square.

The first interconnect substrate 103 and the second interconnect substrate 101 have two types of lands (first lands 111 and second lands 113) arranged thereon. These lands function as bonding lands on which the bump electrodes such as solder balls are disposed. The plane geometry of the second land 113 is a polygon characterized by the inscribed circle thereof having an area smaller than the area of the inscribed circle of the first lands 111. More specifically, the plane geometry of the first lands 111 is a near circle, and the plane geometry of the second lands 113 is a near-regular polygon. Still more specifically, the plane geometry of the second lands 113 is a near-regular square.

On the surfaces of the individual substrates, opposed with the other substrates, the area of the first lands 111 and the area of the second lands 113 are almost equal.

The gap between the first interconnect substrate 103 and the second interconnect substrate 101, in the region where the second lands 113 are arranged, is larger than the gap between the first interconnect substrate 103 and the second interconnect substrate 101 in the region where the first lands 111 are arranged.

The first interconnect substrate 103 causes warping, when placed on a horizontal plane so as to direct the semiconductor chip 105 upward, as being lowered from the horizontal plane at the center where the semiconductor chip 105 is disposed, and as being elevated above the horizontal plane at the circumferential portion. As a consequence, the distance between the second interconnect substrate 101 and the first interconnect substrate 103 is short at the center portion of the substrate, and long at the circumferential portion. Of the circumferential portion of the first interconnect substrate 103, the corner portions cause particularly large warping as compared with that at the center portions of the edges.

The first interconnect substrate 103 has a plurality of first lands 111 and a plurality of second lands 113 provided on the surface thereof opposed to the second interconnect substrate 101. The first lands 111 on the first interconnect substrate 103 are arranged at the location corresponded to the first lands 111 provided to the second interconnect substrate 101. Similarly, the second lands 113 on the first interconnect substrate 103 are arranged at the location corresponded to the second lands 113 provided to the second interconnect substrate 101. The semiconductor chip 105 is mounted on the first interconnect substrate 103 on the back surface side opposite to the surface faced to the second interconnect substrate 101. Between the semiconductor chip 105 and the first interconnect substrate 103, an underfill resin 107 is provided. Electro-conductive components (not shown) of the semiconductor chip 105 and electro-conductive components (not shown) of the first interconnect substrate 103 are bonded through bonding bumps 109.

Also on the second interconnect substrate 101, a plurality of first lands 111 and a plurality of second lands 113 are provided on the surface thereof opposed with the first interconnect substrate 103. On the back surface side of the surface opposed to the first interconnect substrate 103, the second interconnect substrate 101 is molded with a molding resin 121.

The semiconductor device 100 includes first bumps (first solder balls 115) bonded to the first lands 111 and second bumps (second solder balls 117) bonded to the second lands 113, wherein the height of the second solder balls 117 is larger than the height of the first solder balls 115.

The second lands 113 and the first lands 111 are arranged along the circumferences of the first interconnect substrate 103 and the second interconnect substrate 101 according to an orthogonal lattice pattern. The first interconnect substrate 103 and the second interconnect substrate 101 have a plane geometry of near-rectangle, have the first lands 111 and the second lands 113 arranged thereon along the edges of the rectangle, wherein the second lands 113 and the first lands 111 are disposed in this order as viewed from the corners of the rectangle towards the centers of the edges.

The corners of the first interconnect substrate 103 cause a particularly large warping, and consequently have the distance between the second interconnect substrate 101 and the first interconnect substrate 103 larger than in the center portions of the edges. In the vicinity of the corners of the first interconnect substrate 103 and the second interconnect substrate 101, that is, in the region where distance between the substrates is relatively large, a plurality of second lands 113 are arranged according to an orthogonal lattice pattern. On the other hand, in the regions between the adjacent corner portions on the first interconnect substrate 103 and the second interconnect substrate 101, that is, in the region where the distance between the substrates is relatively short, a plurality of first lands 111 are arranged according to an orthogonal lattice pattern.

The plurality of first lands 111 and the plurality of second lands 113 are arranged according to a row pattern on one surface of the first interconnect substrate 103 and the second interconnect substrate 101, wherein in the direction of formation of the row, the width of the second lands 113 is not larger than the width of the first land 111.

Moreover, the lattice pitches of the first lands 111 and the second lands 113 are almost equal. The lattice pitch of the lands herein means the distance between the centers of circle or oval, when the lands have a circular or an oval geometry, such as the first lands 111. On the other hand, it means the distance between the center of the inscribed circles of polygon, when the lands have a polygonal geometry, such as the second lands 113.

The first lands 111 are arranged at the location where the gap between the packages is small, that is, on the corners and at the region between the adjacent corners, on the first interconnect substrate 103 and on the second interconnect substrate 101. Size of the first lands 111 may be selected so far as it does not adversely affect the interconnect.

The second lands 113 are arranged on four corners where the gap between the packages is large. The plane geometry of the second lands 113 is a regular square, and the radius of the inscribed circle of the regular square is smaller than the radius of the first lands 111. The area of the second lands 113 in the semiconductor device 100 is equal to the area of the first lands 111. The area of the inscribed circle of the second lands 113 is smaller than the area of the inscribed circle of the first lands 111. The corners of the second lands 113 may be rounded typically by the rounding process.

Next, an exemplary method of manufacturing the semiconductor device 100 will be explained.

The semiconductor device 100 is obtained by preparing a first package containing the first interconnect substrate 103 and a second package containing the second interconnect substrate 101, and by bonding the both. In this process, the geometry of the lands, used for solder bonding between the substrates in the region where the gap between the substrates is small, is selected as a circular or polygonal geometry, and the geometry of those in the region having the larger gap is selected as a polygon having a smaller number of vertexes.

More specifically, the first lands 111 and the second lands 113 are disposed respectively at predetermined locations on one surface of the second interconnect substrate 101. The other surface is molded with the molding resin 121. On the first lands 111 and on the second lands 113, the first solder balls 115 and the second solder balls 117 are respectively formed. Volume of the first solder balls 115 and the second solder balls 117 is adjusted almost equal. For the case where the volume of the first solder balls 115 and the second solder balls 117 is not intentionally differed from each other, variation in the volume only to a degree not substantially influential to the bonding strength may occur in the process of manufacturing.

The solder balls herein heated and liquefied for bonding tend to form spheres. On the second lands 113, the solder has a tendency of staying within the inscribed circles thereof on the second lands 113 with the aid surface tension exerted on the vertexes of polygon. As a consequence, the second solder balls 117 bonded to the second lands 113 mainly reside with the inscribed circles of the second lands 113.

The strategy taken herein is such as adjusting the heights of the first solder balls 115 and the second solder balls 117 so as to adapt them to the gap between the packages, making use of the sphere-forming tendency of solder, by making difference in the area of the inscribed circles of the first lands 111 and the second lands 113.

Figure 3:
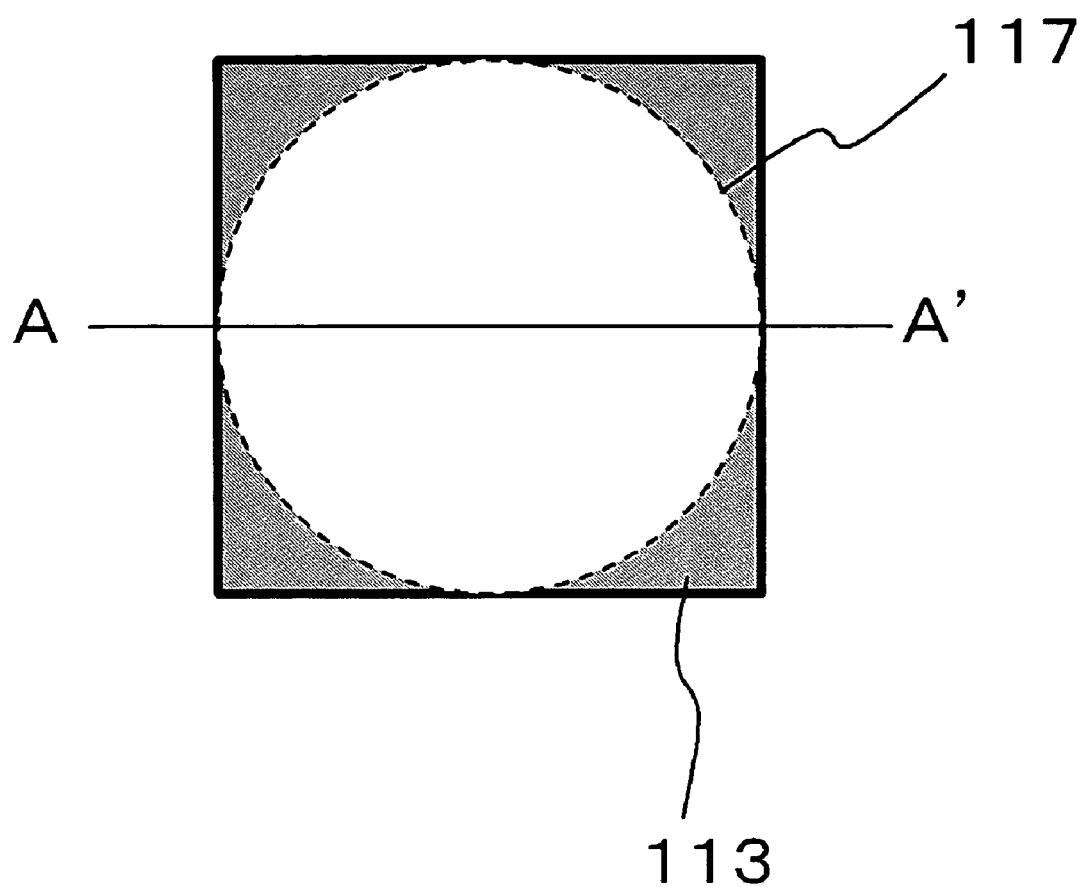
FIG. 3 is a plan view explaining bonding of the solder bumps to the second lands of the semiconductor device in one embodiment.
Figure 4:
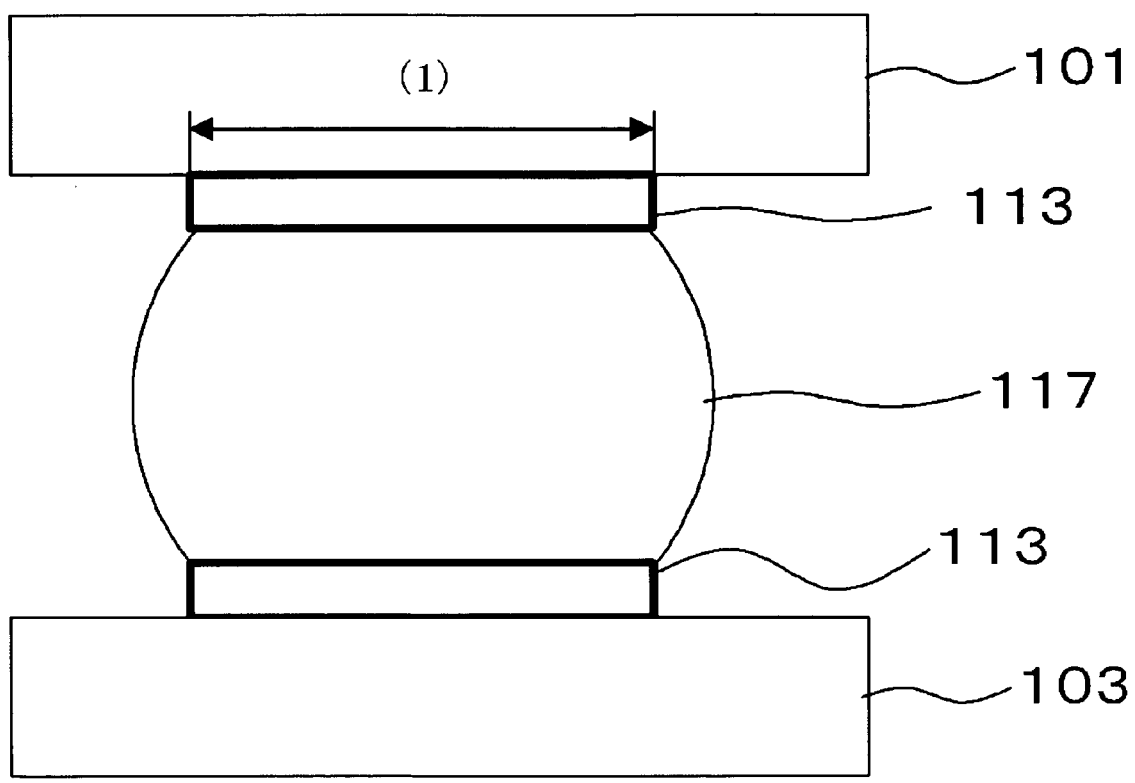
FIG. 4 is a sectional view taken along line A-A' in FIG. 3.
Figure 5:
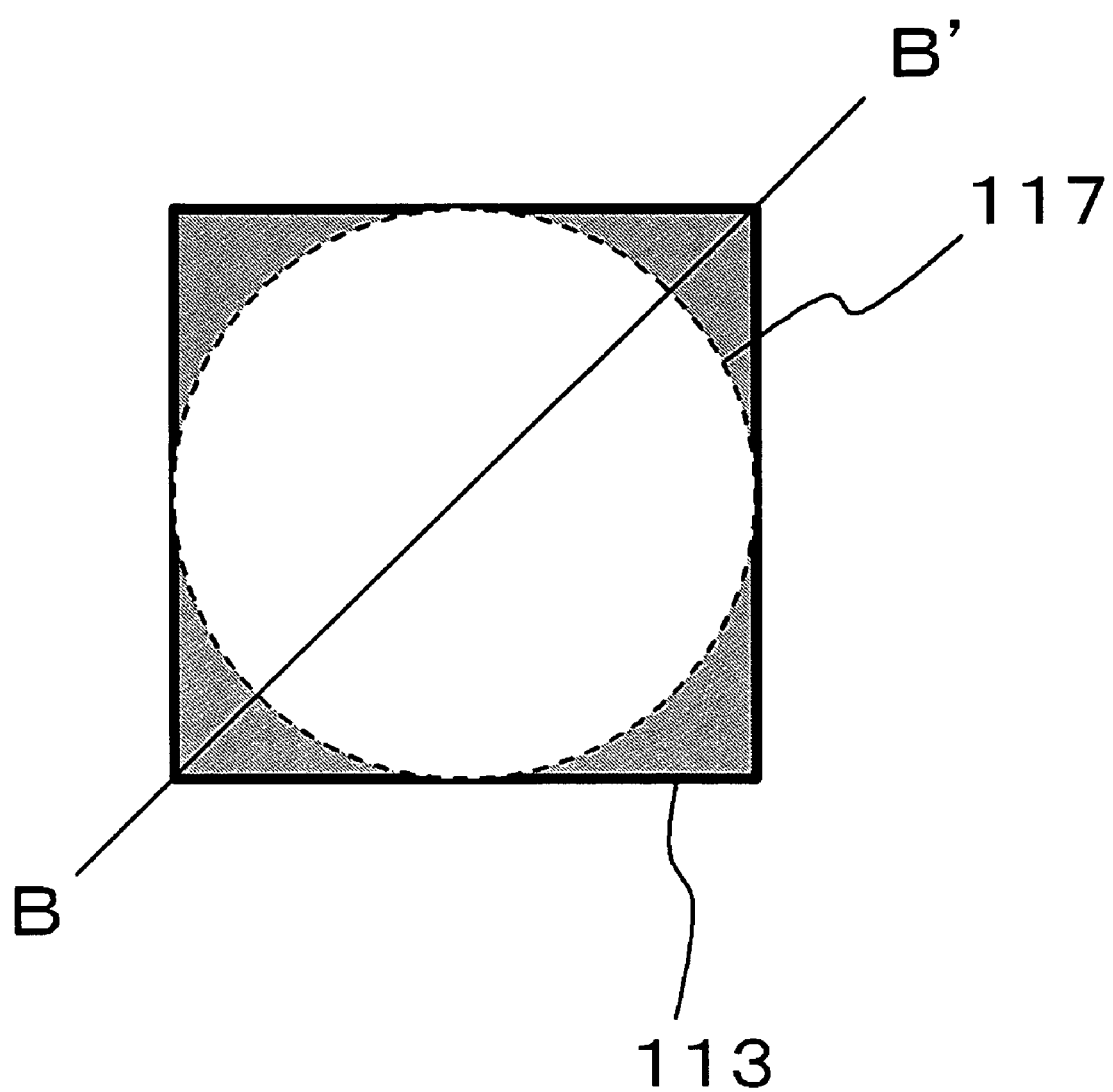
FIG. 5 is a plan view explaining bonding of the solder bumps to the second lands of the semiconductor device in one embodiment.
Figure 6:
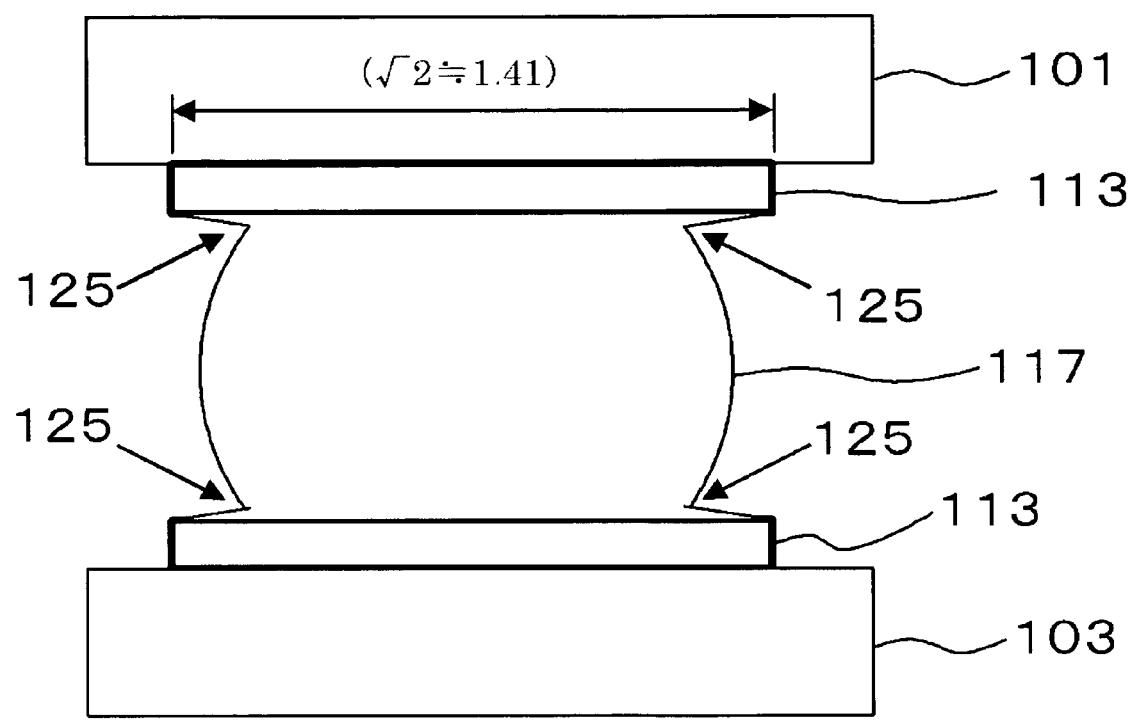
FIG. 6 is a sectional view taken along line B-B' in FIG. 5.

FIG. 3 and FIG. 5 are plan views explaining bonding of one second solder ball 117 to one second land 113. FIG. 4 is a sectional view taken along line A-A' in FIG. 3, and FIG. 6 is a sectional view taken along line B-B' in FIG. 5. FIG. 4 shows a section obtained when the second land 113 was cut at the center of regular square in parallel with the edge. On the other hand, FIG. 6 shows a section obtained when the second land 113 was cut at the center of regular square in the direction of diagonal line.

The length of one edge of the regular square shown in FIG. 3 to FIG. 6 is now given as 1. A substantial bonding portion, occupied by the second solder ball 117 in a liquefied state under the sphere-forming tendency, tends to form a circle having a diameter of 1, which is equal to the length of one edge of regular square. In practice, the solder swells out into the hatched portion outside the circle shown in FIG. 3 and FIG. 5, but the corner portions of the regular square cause recesses 125 as shown in FIG. 6, due to surface tension. The plane geometry of the recesses 125 is a circle. The radius of the recesses 125 increases as the radius of the inscribed circles of the lands increase.

Figure 7:
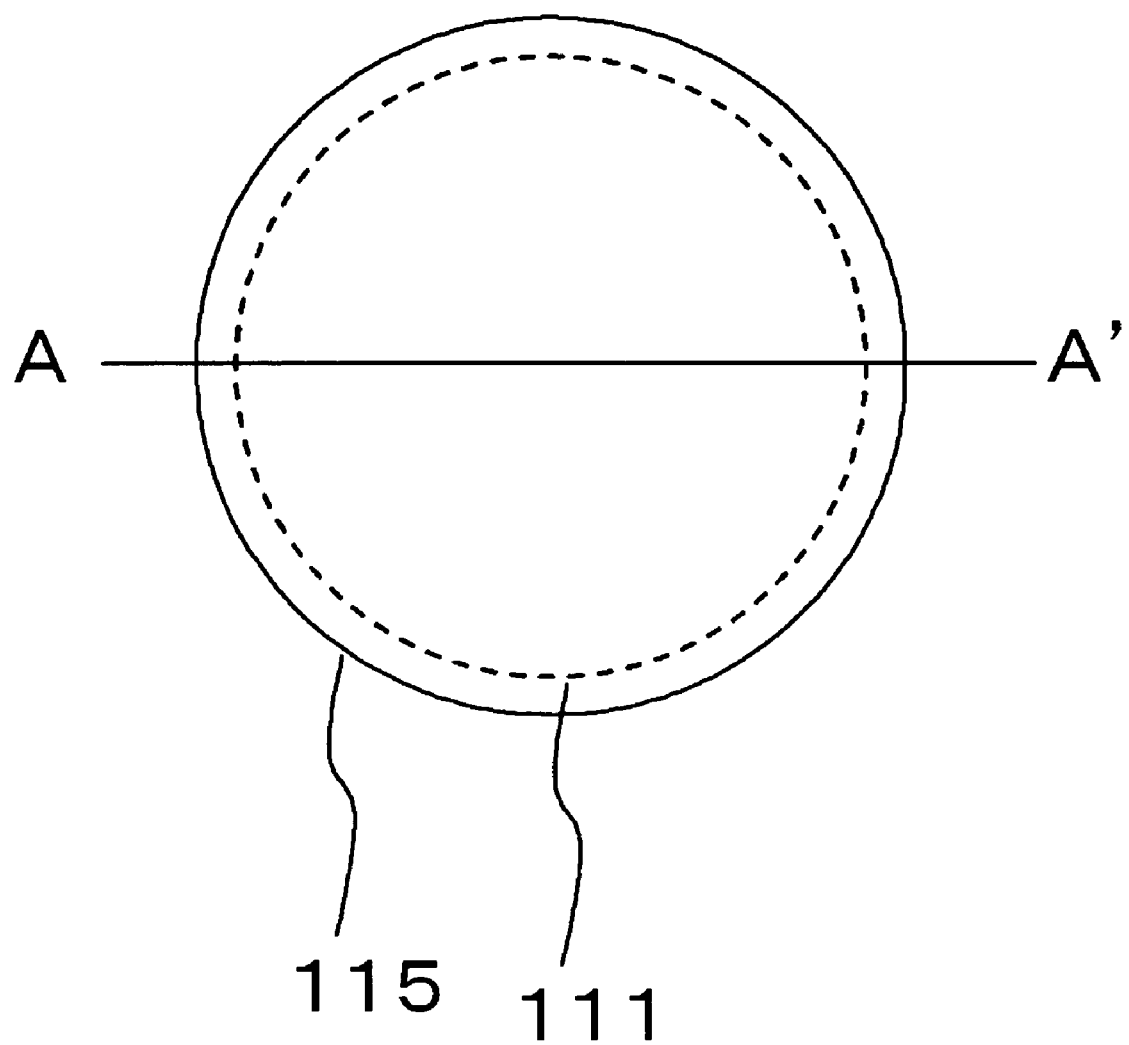
FIG. 7 is a plan view explaining bonding of the solder bumps to the first lands of the semiconductor device in one embodiment.
Figure 8:
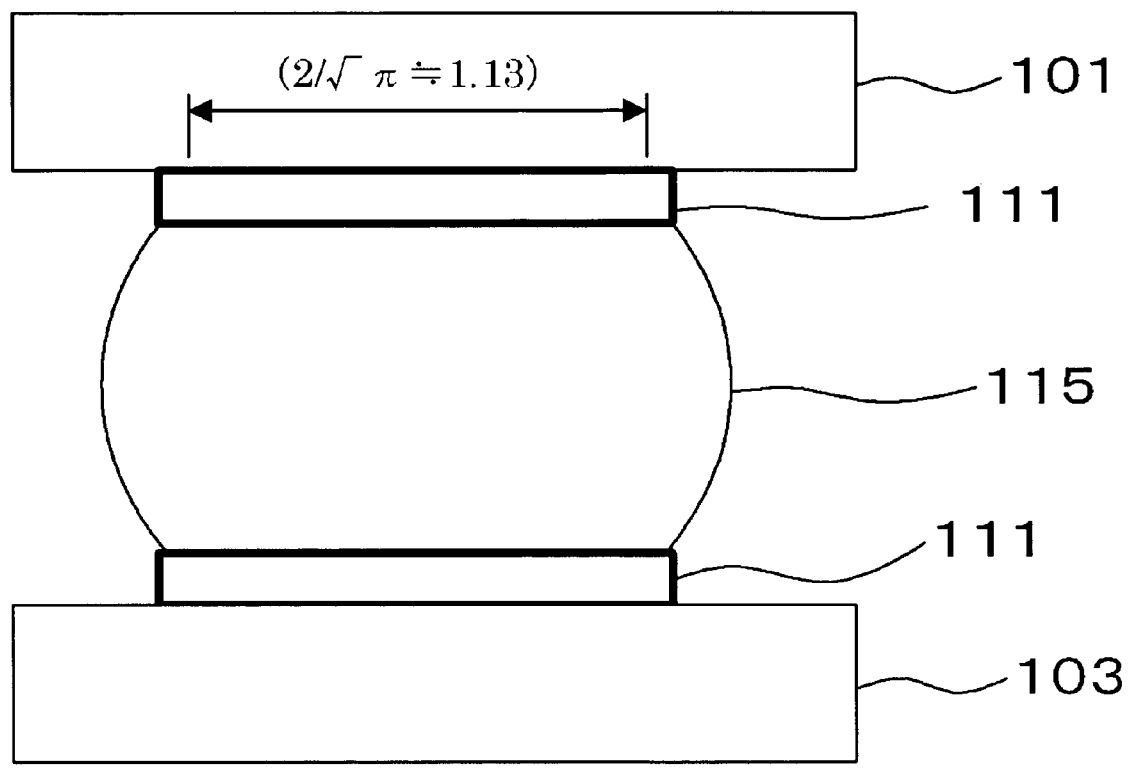
FIG. 8 is a sectional view taken along line A-A' in FIG. 7.

On the other hand, FIG. 7 is a plan view explaining bonding of one first solder ball 115 to one first land 111. FIG. 8 is a sectional view taken along line A-A' in FIG. 7. As shown in FIG. 7 and FIG. 8, the first solder ball 115 is bonded over the entire surface of the first land 111, if the first land 111 has a circular geometry. If the area of the first land 111 equals to the area of the second land 113, the diameter of circle of the first land 111 will have a value of $2/\sqrt{\pi} \approx 1.13$ relative to 1 which is the length of one edge of regular square of the second land 113. The first solder ball 115 bonded to the first land 111 therefore shows a larger in-plane spreading than that shown by the second solder ball 117 bonded to the second land 113. When the first solder balls 115 and the second solder balls 117 have an equal volume, the height of the balls is adjustable making use of this difference.

Referring now back to FIG. 1 and FIG. 2, the first interconnect substrate 103 having the semiconductor chip 105 mounted thereon causes warping in the direction of the semiconductor chip 105. The amount of warping of the first interconnect substrate 103 may vary depending on the size of the semiconductor chip 105, location of its disposition and so forth, wherein it is possible to estimate the warping after being mounted, as early as when the size and disposition of the semiconductor chip 105 to be mounted on the first interconnect substrate 103 are determined in the design phase.

The geometry and arrangement of the second lands 113 and the first lands 111 are then determined so as to adjust the heights of the second solder balls 117 and the first solder balls 115, depending on thus-estimated amount of warping of the first interconnect substrate 103. In this process, it is preferable to equalize the area of the first lands 111 and the second lands 113 as in the semiconductor device 100. This configuration can ensure the bonding strength of the first solder balls 115 and the second solder balls 117 at an equivalent level. As will be described later referring to FIG. 9, it is made possible to more reliably arrange interconnects 123 (FIG. 9) between the first lands 111 and the second lands 113.

The first lands 111 and the second lands 113 are formed typically on both of the first interconnect substrate 103 and the second interconnect substrate 101, as in the semiconductor device 100. By providing the first lands 111 and the second lands 113 to the second interconnect substrate 101, and by providing, on the first interconnect substrate 103, the first lands 111 at the location corresponded to the first lands 111 on the second interconnect substrate 101, and the second lands 113 at the location corresponded to the second lands 113 on the second interconnect substrate 101, it is made possible to adjust the maximum diameter of the first solder balls 115 and the second solder balls 117 on both sides of the second interconnect substrate 101 and the first interconnect substrate 103. The height of these solder balls are therefore adjustable in a further precise manner.

The semiconductor chip 105 is mounted on the chip-mounting surface of the first interconnect substrate 103 having the lands already formed thereon, while placing the bonding bumps 109 in between. The underfill resin 107 is filled between the semiconductor chip 105 and the first interconnect substrate 103. Third solder balls 119 are formed on the back surface of the chip-mounting surface of the first interconnect substrate 103.

The second interconnect substrate 101 and the first interconnect substrate 103 are then bonded while placing the second solder balls 117 and the first solder balls 115 in between. According to the procedures described in the above, the semiconductor device 100 is obtained.

In the semiconductor device 100, there are two types of plane geometry, circle and polygon, of the lands on which the first interconnect substrate 103 having the semiconductor chip 105 mounted thereon, and the second interconnect substrate 101 as the other substrate are bonded using a solder. The second lands 113 having a geometry with a smaller number or vertexes are formed in the region where the gap between the second interconnect substrate 101 and the first interconnect substrate 103 is large. This configuration can make the height of the second solder balls 117 provided in the region with a large substrate gap larger than the height of the first solder balls 115. As a consequence, disconnection of the second solder balls 117 can effectively be suppressed. The lands having a circular plane geometry such as the first lands 111 can be handled as a regular polygon having the number of vertexes sufficiently larger than that of the second lands 113.

Area of the lands affects the bonding strength of the solder balls, so that it is necessary to ensure a sufficient area both for the first lands 111 and the second lands 113. In this context, the bonding strength between the lands and the solder balls depends on the area of the lands. In the semiconductor device 100, the first lands 111 and the second lands 113 have an almost same area. As a consequence, a sufficient level of bonding strength between the lands and the solder balls can be ensured both for the first lands 111 and the second lands 113.

Because the first lands 111 and the second lands 113 in this embodiment have an almost same area, reliability of the bonding can further be improved. For example, in the conventional configuration, disposition of the lands 211 of a small area at four corners of the first interconnect substrate 203, inverted from the arrangement shown in FIG. 18 described later in a second embodiment, has raised an anticipation of degrading the reliability, because of concentration of stress to four corner portions between the packages if any impact is exerted on the packages. In contrast in this embodiment, the second lands 113 provided to four corners and the fist lands 111 provided to other regions have an almost equal area, so that the bonding strength of the bumps with respect to these lands can be maintained at an almost same level. As a consequence, a sufficient level of bonding reliability between the lands and the solder balls can be ensured, even in the region where stress concentrates.

In the configuration having almost same land area, the stereo geometry of the solder balls is determined by the inscribed circle of the lands, if the lands have a polygonal geometry. The second solder balls 117 bonded to the polygonal second lands 113 will have a height larger than that of the first solder balls 115 bonded to the circular first lands 111. The width and height of the solder balls under bonding can therefore be effectively controlled, without varying volume of the solder balls. The height of the solder balls is therefore adjustable in the PoP technology, as being adapted to the gaps between the individual packages differed due to warping. It is therefore made possible to avoid bonding failure and degradation in the reliability ascribable to difference in the degree of warping of the individual packages.

The first lands 111 and the second lands 113 in the semiconductor device 100 have an almost same area, so that, even for the case where the first lands 111 and the second lands 113 are arranged at the same lattice pitch, a nonconformity such that either one of the spaces between the adjacent first lands 111 and between the adjacent second lands 113 becomes extremely smaller than the other is avoidable. This effect exhibits distinctively when the gap between the adjacent first lands 111 and the gap between the adjacent second lands 113 are almost equal. This effect exhibits distinctively also when the first lands and a plurality of second lands are arranged in rows, and when the width of the second lands 113 in the direction of the rows is not larger than the width of the first lands 111.

Figure 9A:
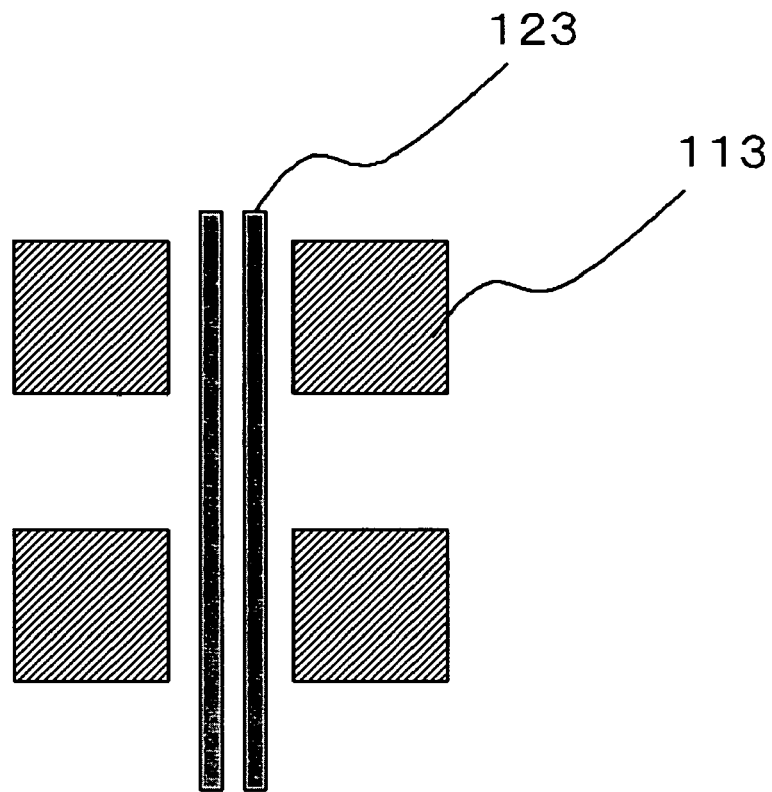
FIGS. 9A and 9B are plan views explaining arrangement of the lands and interconnects of the semiconductor device in one embodiment.
Figure 9B:
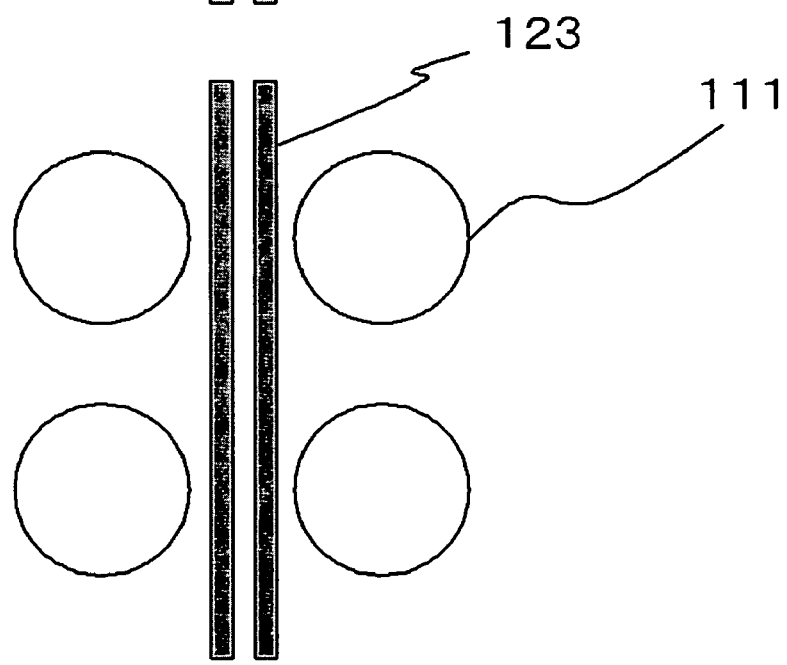

FIG. 9A and FIG. 9B are drawings explaining arrangements of interconnects between the first lands 111 and between the second lands 113 having an almost same area. FIG. 9A shows an arrangement of the interconnects 123 laid between the second lands 113, and FIG. 9B shows an arrangement of the interconnects 123 laid between the first lands 111. As shown in FIG. 9A and FIG. 9B, the interconnects 123 are formed between the lands. Because the pitch of formation of the interconnects 123 is determined by the design rule, narrower gap between the lands makes arrangement of the interconnect difficult. A sufficient width of space is ensured in the semiconductor device 100, between any of both of the adjacent first lands 111 and the adjacent second lands 113, allowing arrangement of the interconnects 123 with an equivalent density.

Another embodiment will be explained below mainly referring to aspects which differ from those in the first embodiment.

Second Embodiment

The semiconductor device 100 shown in FIG. 1 dealt with the case where the gap between the substrates is large at four corners, whereas another possible configuration is such as having a large gap at the center of the substrates.

Figure 10:
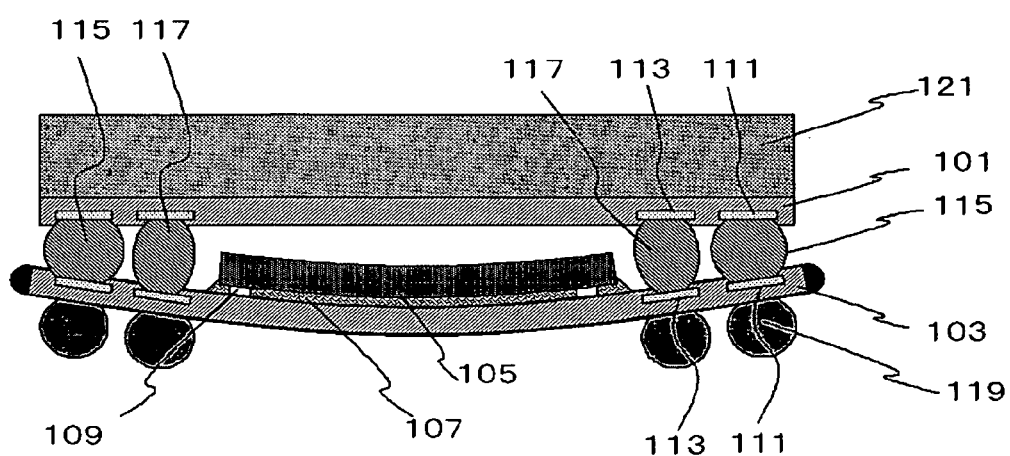
FIG. 10 is a sectional view showing a configuration of a semiconductor device in one embodiment.
Figure 11:
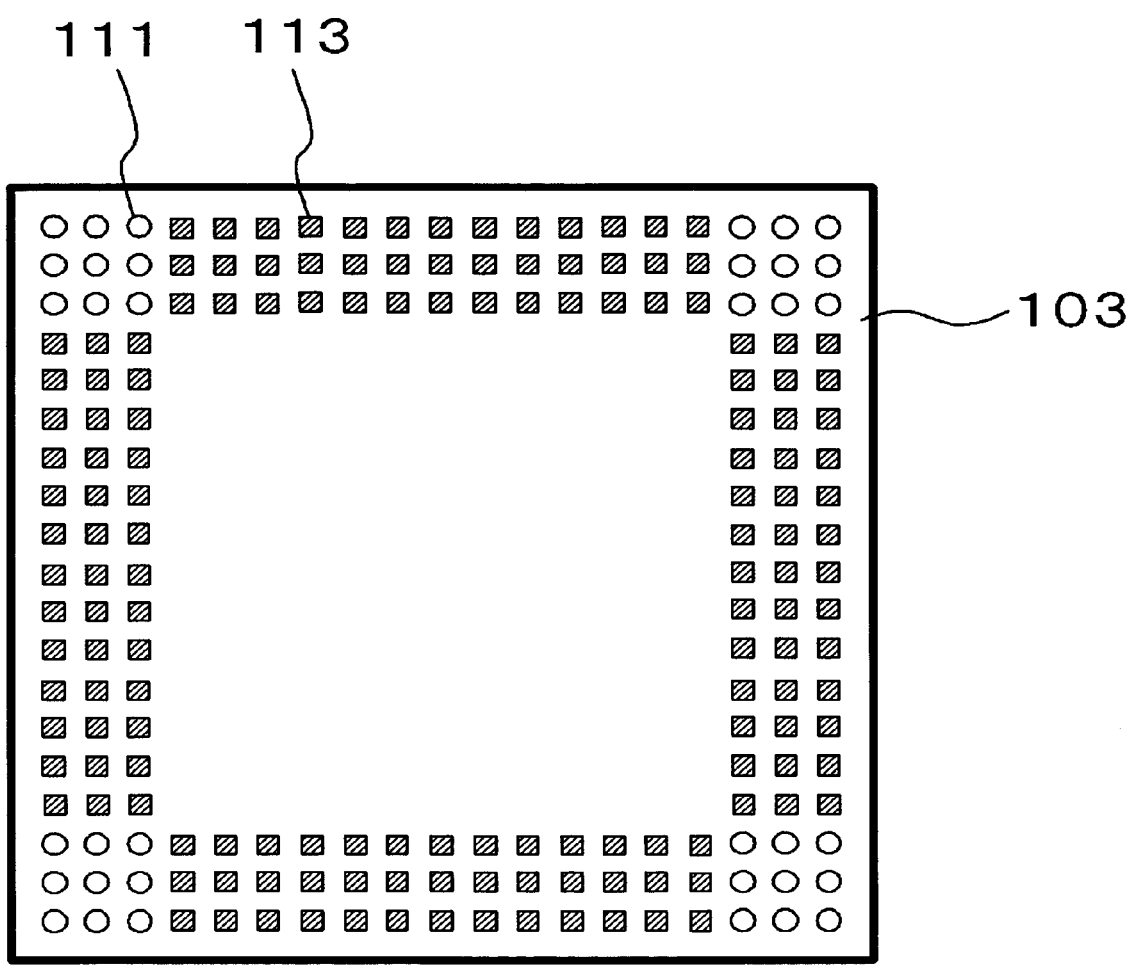
FIG. 11 is a plan view showing a configuration of the first interconnect substrate of the semiconductor device shown in FIG. 10.

FIG. 10 is a sectional view showing a configuration of a semiconductor device of this embodiment. FIG. 11 is a drawing showing a plane geometry of the surface, opposed with the first interconnect substrate 103, of the second interconnect substrate 101 of the semiconductor device shown in FIG. 10. Also the plane geometry and plane arrangement of the lands in the second interconnect substrate 101 may be same as those in the configuration shown in FIG. 10. A basic configuration of the semiconductor device shown in FIG. 10 and FIG. 11 is similar to that of the semiconductor device 100 in the first embodiment, except that the arrangement of the first lands 111 and the second lands 113 is inverted.

More specifically, the plane geometry of the first interconnect substrate 103 and the second interconnect substrate 101 is near-rectangular, wherein the first lands 111 and the second lands 113 are provided along the edges of the rectangle, and the first lands 111 and the second lands 113 are arranged in this order as viewed from the corners of the rectangle towards the centers of the edges. Circular first lands 111 are disposed on the first interconnect substrate 103 and the second interconnect substrate 101 at four corners with a small substrate gap, and square second lands 113 are disposed at the center portions of the edges of the substrates.

Also in this embodiment, the second lands 113 having a smaller radius of the inscribed circle are disposed in the region with a larger inter-substrate gap, and the circular first lands 111 having a radius larger than the inscribed circle of the second lands 113 are disposed in the region with a smaller inter-substrate gap. This configuration ensures the same effect with the first embodiment.

Japanese Laid-Open Patent Publication No. H9-8081 described in the above in the section of RELATED ART adopts a configuration in which the lands having a larger area are disposed on four corners of the substrate similarly to as in this invention, when the substrates are stacked while disposing the semiconductor chip in between. This configuration, however, has been anticipated, also as described above in the first embodiment, in that the interconnects cannot be laid between the lands at four corners of the substrate.

Figure 18:
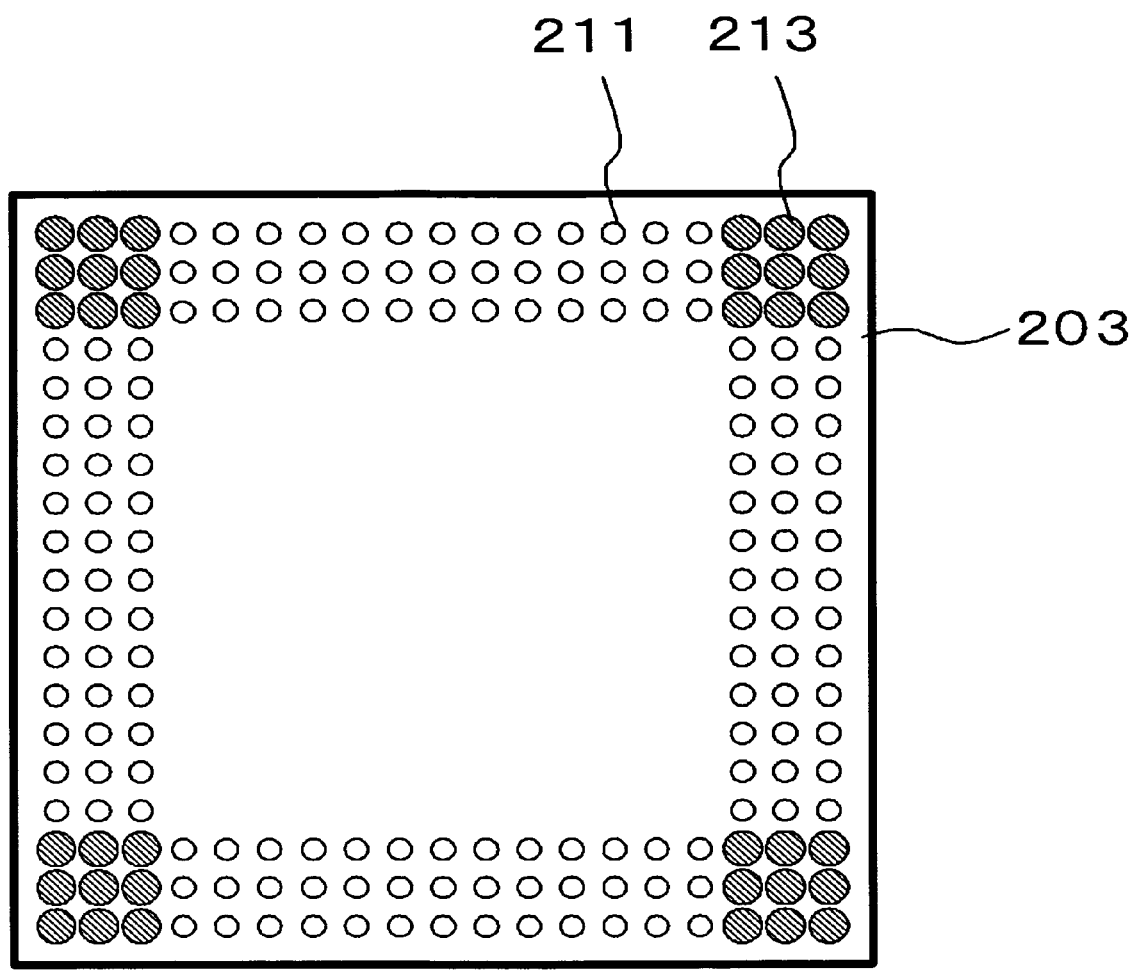
FIG. 18 is a plan view showing a configuration of an interconnect substrate of the semiconductor device.
Figure 19A:
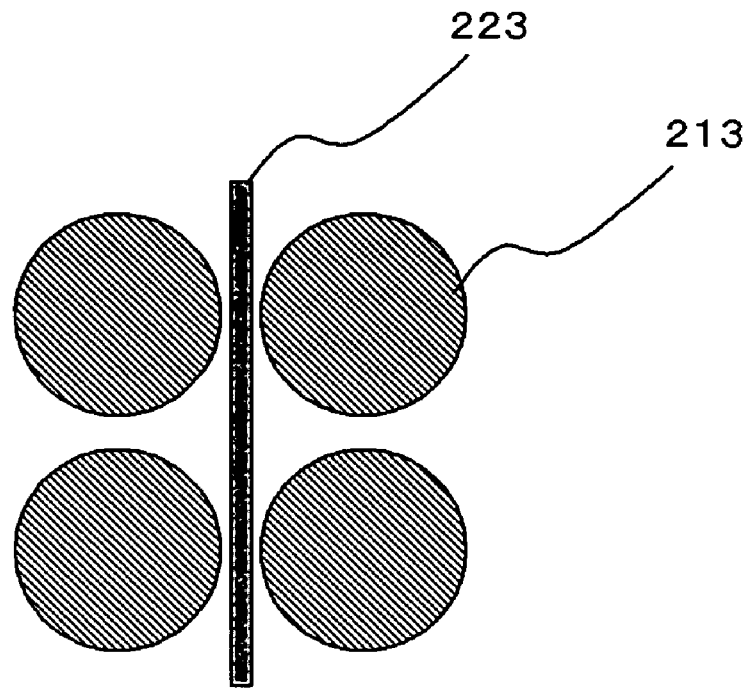
FIGS. 19A and 19B are plan views explaining arrangements of the lands and the interconnects of the conventional semiconductor device.
Figure 19B:
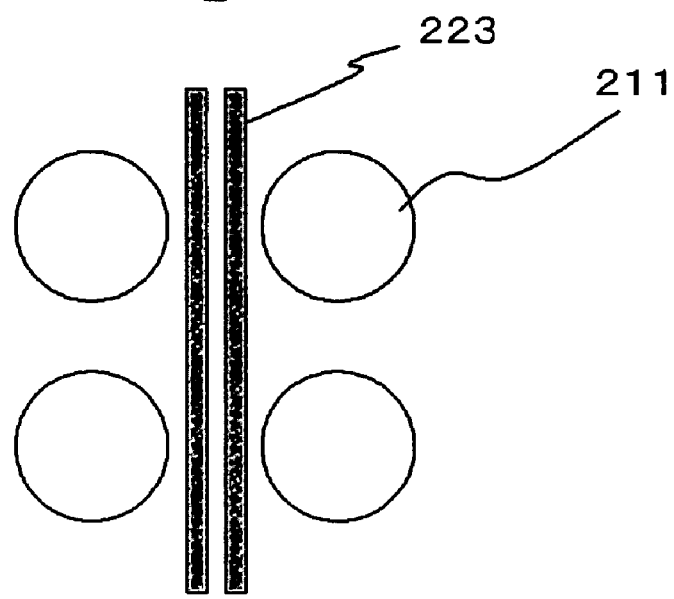

FIG. 18 and FIG. 19 are drawings explaining the problem. FIG. 18 shows two types of circular lands arranged according to an orthogonal lattice on the first interconnect substrate 203. Of these, the lands 213 disposed at four corners of the first interconnect substrate 203 have a larger radius than that of the lands 211 disposed at the regions other than four corners. In this configuration, two interconnects 223 can be laid between the lands 211 having the smaller radius as shown in FIG. 19B, whereas only one interconnect 223 can be laid 223 between the lands 213 having the larger radius. As is clear from the above, an anticipation has arisen in that adoption of the similar land geometry may fail in obtaining a sufficient space between large lands.

In contrast to this, the first lands 111 and the second lands 113 in this embodiment have almost equal areas, but differ only in the plane geometry. As a consequence, as described in the above referring to FIG. 9A and FIG. 9B, a sufficient interconnect space can be ensured between the lands of either type. It is also made possible to further improve the reliability of bonding, by virtue of close equality of area of the first lands 111 and the second lands 113.

Paragraphs in the above has described the embodiments of the present invention referring to the attached drawings, wherein they are merely examples of the present invention, allowing adoption of any various configurations other than those described in the above.

For example, the description in the above has dealt with the case where the plane geometry of the first lands 111 is circle and the plane geometry of the second lands 113 is regular square, without limiting combinations of the plane geometries of the first lands 111 and the second lands 113.

The plane geometries of the first lands 111 and the second lands 113 may be set, depending on the distance between the second interconnect substrate 101 and the first interconnect substrate 103. In this case, volume of the solder balls used for the bonding portion of the individual packages, and area of bonding lands are made uniform in the individual packages, and the height of the solder balls is adjusted based on the geometry of the lands in the bonding portion between the individual packages. The geometry of the lands is adjusted so as to adapt them to the gaps between the packages, differed by locations due to warping of the individual packages. This configuration allows stacking of the packages having different state of warping, without complicating the process, jigs and interconnect design, and without degrading the reliability.

In this case, the plane geometry of the lands is selected as circle, in the region where the gap between the packages is small. The lands are then arranged so as to increase the number of vertexes of polygon as the gap widens, that is, from those having a near-circle geometry to those having a smaller number of vertexes. It is also allowable to provide three types or more lands differed in the number of vertexes. For example, circular, pentagonal, tetragonal, and triangular lands can be arranged in this order as the distance between the substrates increases.

The description in the above dealt with the case where both of the second interconnect substrate 101 and the first interconnect substrate 103 have the first lands 111 and the second lands 113 provided thereon. It is, however, good enough that the first lands 111 and the second land 113 are provided on at least either one of the second interconnect substrate 101 and the first interconnect substrate 103. For example, the first lands 111 and the second lands 113 may be provided to the second interconnect substrate 101 on which the second solder balls 117 and first solder balls 115 are provided, and all of the lands on the first interconnect substrate 103 may have the same plane geometry. It is also allowable to provide the first lands 111 and the second lands 113 on the first interconnect substrate 103 having the semiconductor chip 105 mounted thereon, and to equalize the geometry of all lands on the second interconnect substrate 101.

Examples of the land geometry include circle, oval, polygon and so forth. Among the same polygons, regular ones have larger ability of height adjustment. Circle is supposed to be a regular polygon having an infinite number of vertexes.

It is also allowable that the plane geometry of the first lands 111 is a near-regular polygon, and the plane geometry of the second lands 113 is a near-regular polygon having a smaller number of vertexes than that of the first lands 111. When compared among the first lands 111 and the second lands 113 having an equal area, those having a smaller number of vertexes have a smaller area of inscribed circles, which can reduce the degree of in-plane spreading of the solder balls, and can make their height large. For example, the first lands 111 may have a circle geometry, and the second lands 113 have a regular-triangle geometry. It is still also allowable that the first lands 111 have a hexagonal geometry, and the second lands 113 have a regular square geometry.

Figure 12:
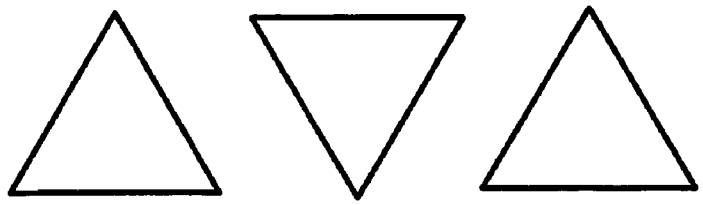
FIG. 12 is a plan view explaining an arrangement of the lands of the semiconductor device in one embodiment.
Figure 12:
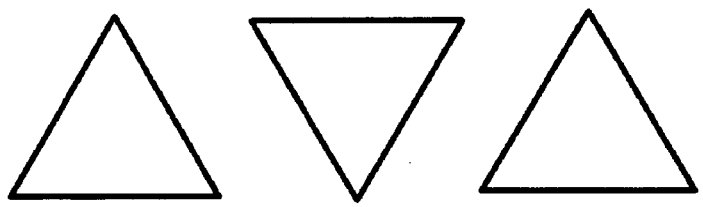
Figure 12:
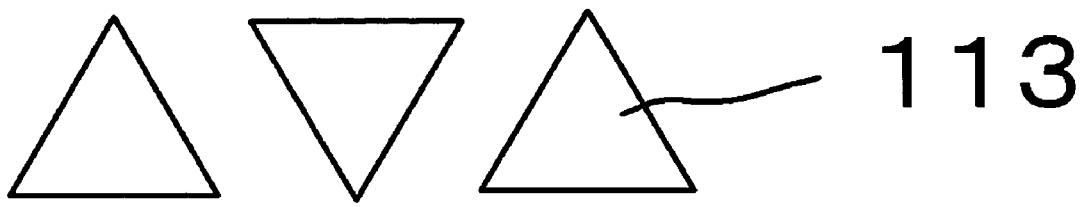
Figure 12:
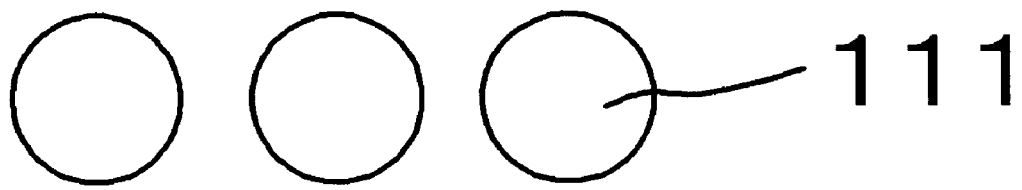
Figure 12:
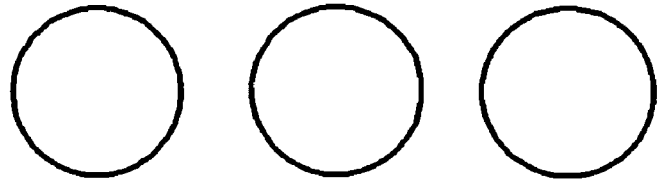
Figure 12:
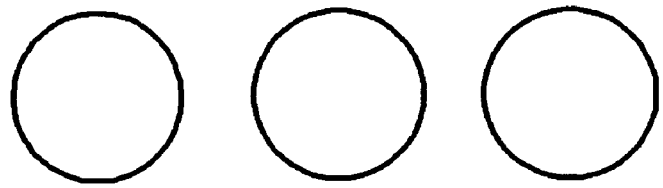
Figure 13A:
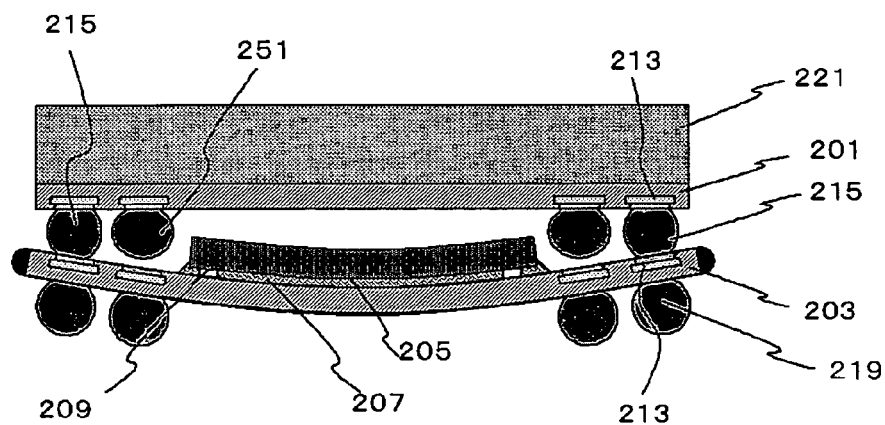
FIGS. 13A to 17B are sectional views showing configurations of conventional semiconductor devices.
Figure 13B:
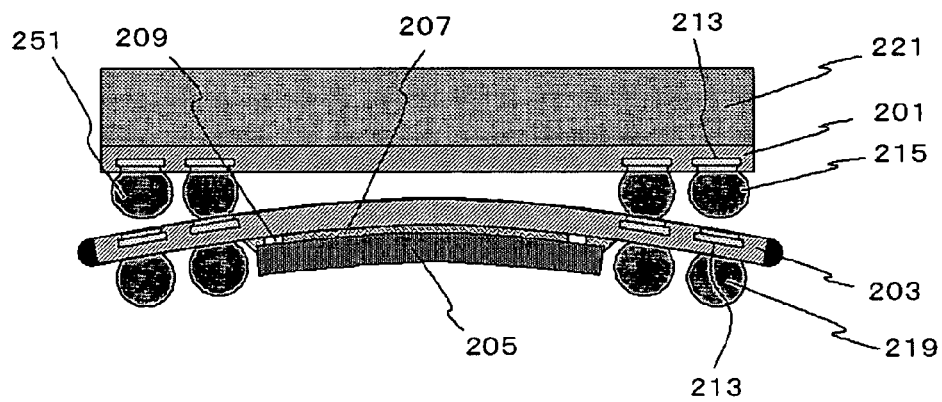
Figure 14A:
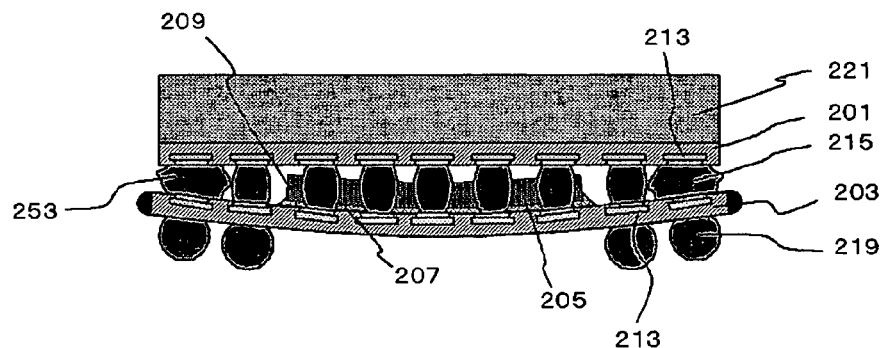
Figure 14B:
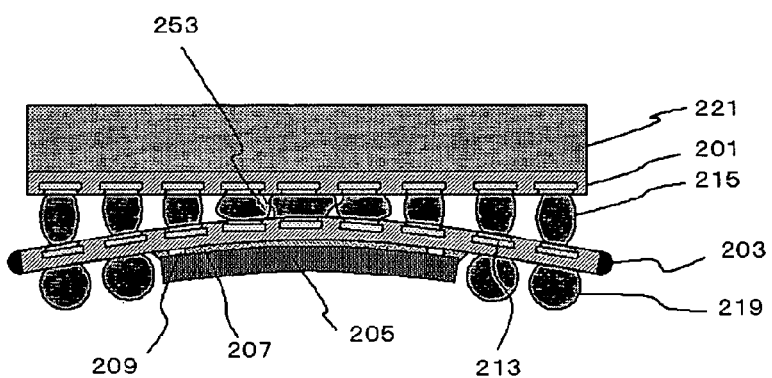
Figure 15A:
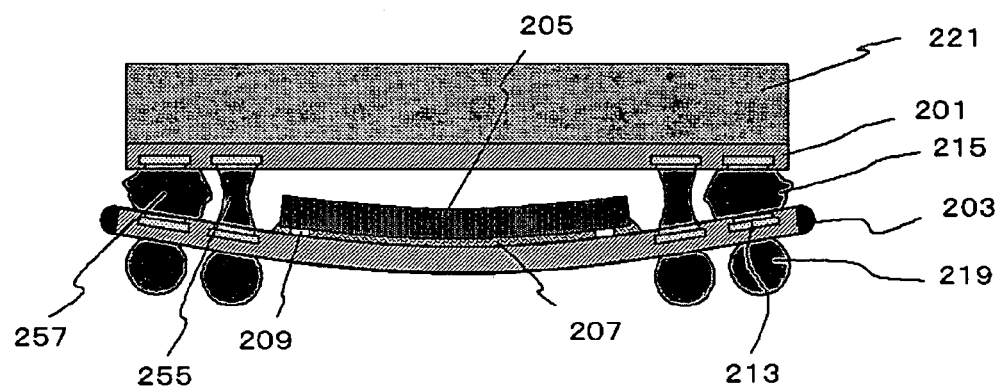
Figure 15B:
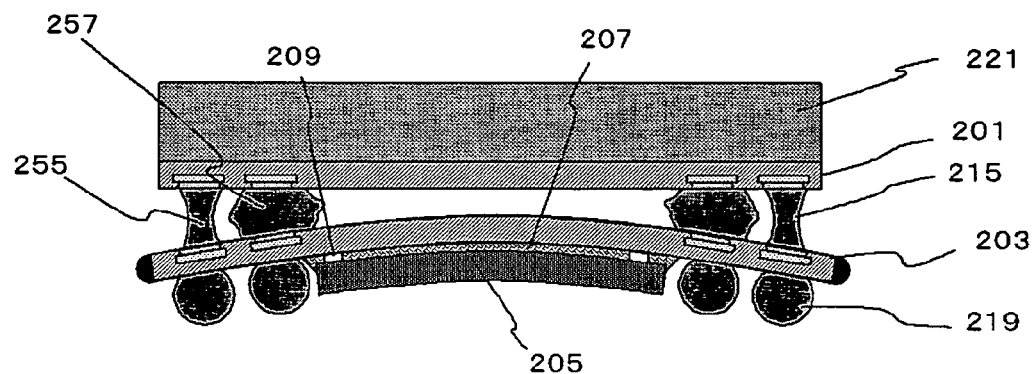
Figure 16A:
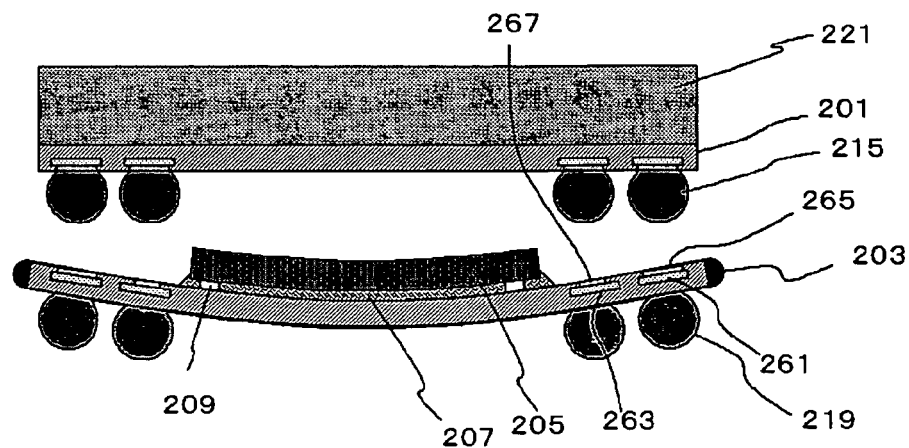
Figure 16B:
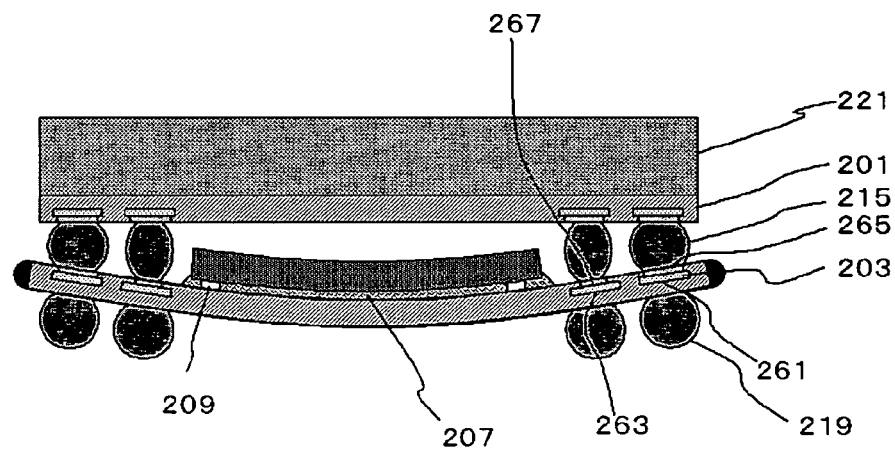
Figure 17A:
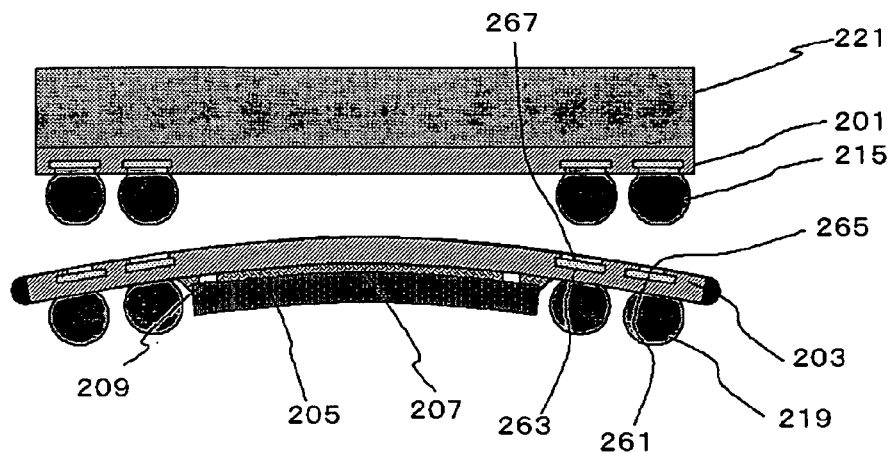
Figure 17B:
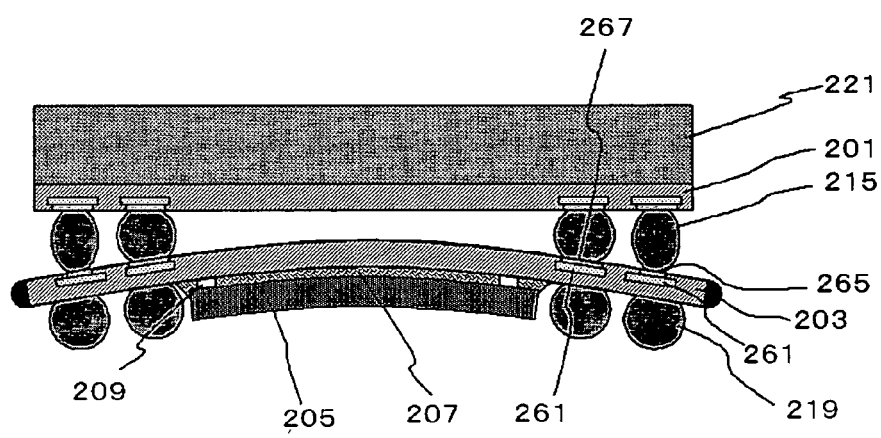

FIG. 12 is a plan view showing an arrangement of an exemplary case where the first lands 111 have a circular geometry and the second lands 113 have a regular triangle geometry. As shown in FIG. 12, a plurality of second lands 113 may be arranged at regular pitches according to a lattice pattern, so that the vertexes of the regular triangle in the adjacent rows are alternately staggered. This arrangement can ensure a space for disposing the interconnect 123 between the adjacent second lands 113, even when configured as the regular triangle ones, to a level equivalent to the space between the adjacent first lands 111.

Although the description in the above dealt with the case where the first lands 111 and the second lands 113 are provided to the interconnect substrates, these lands may be provided to any other mounting substrate such as a BGA (ball grid array) substrate. The first lands 111 and the second lands 113 may be provided also to the substrate before being mounted with any other circuit components, or still also to a substrate having the circuit components already mounted thereon.

The embodiments described in the above simply showed a state of occurrence of warping only on the base package, but the infant package may cause warping in practice, even in the different directions. The embodiments described in the above are exemplary cases where the semiconductor chip is mounted on the base package by flip-chip bonding, mounting a single semiconductor chip on only either one of the upper and lower surfaces of the interconnect substrates. However, in practice, a plurality of semiconductor chips may be bonded in a flip-chip manner on both surfaces. There may still also be the cases where the various bonding techniques described above in the RELATED ART are used.

It is apparent that the present invention is not limited to the above embodiment, that may be modified and changed without departing from the scope and spirit of the invention.

What is claimed is:

1. A substrate, comprising:
   a first land and a second land provided on one surface thereof;
   a first bump connected to said first land; and
   a second bump connected to said second land,
   wherein the plane geometry of said second land is a polygon characterized by the inscribed circle thereof having an area smaller than the area of the inscribed circle of said first land and the height of said second bump is larger than the height of said first bump.

2. The substrate as claimed in claim 1, wherein the plane geometry of said first land is a near-circle, and the plane geometry of said second land is a near-regular polygon.

3. The substrate as claimed in claim 1, wherein, on said one surface, the area of said first land and the area of said second land are nearly equal.

4. The substrate as claimed in claim 1, wherein, on said one surface, a plurality of said first lands and a plurality of said second lands are arranged in rows, and said second lands have the width not larger than the width of said first land, in the direction of formation of said rows.

5. The substrate as claimed in claim 1, wherein, on said one surface, a plurality of said first lands and a plurality of said second lands are arranged in a lattice form.

6. The substrate as claimed in claim 1, wherein the plane geometry of said substrate is a near-rectangle, having said first lands and said second lands provided along the edges of the rectangle, said second lands and said first lands being arranged in this order as viewed from the corners towards the centers of the edges.

7. The substrate as claimed in claim 1, wherein the plane geometry of said substrate is a near-rectangle, having said first lands and said second lands provided along the edges of the rectangle, said first lands and said second lands being arranged in this order as viewed from the corners towards the centers of the edges.

8. A semiconductor device comprising the substrate described in claim 1, and a semiconductor chip stacked thereon.

9. The semiconductor device as claimed in claim 8, wherein said semiconductor chip is mounted on said substrate.

10. The substrate as claimed in claim 1, wherein said first and second lands are electrically isolated from each other.

11. The substrate as claimed in claim 4, wherein said plurality of first lands and the plurality of second lands are electrically isolated from each other.

12. The substrate as claimed in claim 5, wherein said plurality of first lands and said plurality of second lands are electrically isolated from each other.

13. The semiconductor device as claimed in claim 1, wherein bumps are disposed at said first and second lands and the bump at said second land includes a recess at corner portions of said second land.

14. The substrate as claimed in claim 1, wherein said second bump includes a recess at corner portions of said second land.

15. The substrate as claimed in claim 1, wherein said first land and said second land is provided along one peripheral surface of said substrate.

* * * * *